(12) United States Patent
Lines

(10) Patent No.: US 7,541,837 B2
(45) Date of Patent: *Jun. 2, 2009

(54) VOLTAGE LEVEL SHIFTER CIRCUIT

(75) Inventor: Valerie L. Lines, Ottawa (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 11/930,527

(22) Filed: Oct. 31, 2007

(65) Prior Publication Data

US 2008/0054941 A1 Mar. 6, 2008

Related U.S. Application Data

(63) Continuation of application No. 11/347,289, filed on Feb. 6, 2006, now Pat. No. 7,312,636.

(51) Int. Cl.
*H03K 19/094* (2006.01)
*H03K 19/0175* (2006.01)

(52) U.S. Cl. .............. 326/68; 326/80; 326/81

(58) Field of Classification Search .......... 326/68, 326/80, 81; 327/333
See application file for complete search history.

(56) References Cited

U.S. PATENT DOCUMENTS

| | | | |
|---|---|---|---|
| 5,321,324 A | 6/1994 | Hardee et al. | |
| 5,723,986 A | 3/1998 | Nakashiro et al. | |
| 6,043,699 A | 3/2000 | Shimizu | |
| 6,191,636 B1 | 2/2001 | Cress et al. | |
| 6,756,813 B2 | 6/2004 | Harada | |
| 6,774,673 B2 | 8/2004 | Tsuboi et al. | |
| 6,777,981 B2 | 8/2004 | Kobayashi | |
| 6,801,064 B1 | 10/2004 | Hunt et al. | |
| 6,803,801 B2 | 10/2004 | Randazzo et al. | |
| 6,842,043 B1 | 1/2005 | Nguyen et al. | |
| 6,937,065 B2 | 8/2005 | Aoki | |
| 6,954,100 B2 | 10/2005 | Dharne et al. | |
| 7,288,963 B2* | 10/2007 | Nagata | 326/81 |
| 7,312,636 B2* | 12/2007 | Lines | 326/81 |
| 2005/0174159 A1 | 8/2005 | Anton et al. | |

* cited by examiner

*Primary Examiner*—Anh Q Tran
(74) *Attorney, Agent, or Firm*—Shin Hung; Borden Ladner Gervais LLP

(57) ABSTRACT

A level shifter circuit for converting a logic signal with logic '1' and '0' levels at first high and low supply voltage levels to a signal with second high and low supply voltage levels. In particular, the second high and low supply voltage levels are greater than the first high and low supply voltage levels. The disclosed level shifter is configured such that the size of the preceding logic gate and circuitry within the level shifter can be reduced, facilitating its layout in pitch-limited areas. The level shifter also includes circuitry to decouple the output pull-up and pull-down paths to further facilitate state transitions and reduce crowbar current consumption.

18 Claims, 3 Drawing Sheets

VOLTAGE LEVEL SHIFTER CIRCUIT

CROSS-REFERENCE TO RELATED APPLICATIONS

This application is a continuation of application Ser. No. 11/347,289, filed Feb. 6, 2006.

TECHNICAL FIELD

The present invention generally relates to level shifter circuits. In particular, the present invention relates to two voltage level shifter circuits.

BACKGROUND INFORMATION

Voltage level shifting circuits are well known in the art for translating, or converting, digital signals driven with a first set of voltage supplies to a signal driven with a second set of voltage supplies, where the high (or low) voltage output is higher (or lower) than that in the first set of voltage supplies. Voltage level shifting is used in systems where circuits operating with different voltage supplies must communicate with each other.

Those of skill in the art will understand that dynamic random access memory (DRAM) conventionally employs level shifters in the wordline driver circuits of a memory array. The wordline driver circuits in a memory with n-channel cell transistors preferably drive wordlines with a voltage above the logic '1' power supply voltage (typically VDD) to maximize the charge written into and read out from accessed DRAM cells. The wordlines can further be driven to a voltage level below VSS to minimize leakage current from the DRAM cells.

FIG. 1 is a circuit schematic including a level shifter circuit of the prior art that is used to drive wordlines in a DRAM to voltage levels above VDD and below VSS. FIG. 1 includes a logic circuit 12, and a level shifter circuit 10 comprised of n-channel pass transistor 14, p-channel pass transistor 16, cross-coupled p-channel transistors 18 and 20, and cross-coupled n-channel transistors 22 and 24.

Logic circuit 12 is shown as an NAND gate for receiving any number and combination of address signals and control signals, and for providing a single decoded output. Logic circuit 12 is powered by VDD and VSS voltage supplies, and can have any known circuit configuration. The output of logic circuit 12 is split in parallel and passed through n-channel pass transistor 14 and p-channel pass transistor 16. Pass transistor 14 has its gate tied to VDD to isolate logic circuit 12 from voltage VPP (above VDD), while pass transistor 16 has its gate tied to VSS to isolate logic circuit 12 from the negative voltage VBB (below VSS). The drain of transistor 16 is connected to the gate of transistor 24 and the drain of transistor 22. The drain of transistor 14 is connected to the gate of transistor 20 and the drain of transistor 18. Thus when the output of the logic circuit 12 is VDD, that VDD level is passed through transistor 16 to the cross-coupled transistors 22 and 24 such that transistor 24 is on and transistor 22 is off. In parallel, transistor 20 is off and transistor 18 is on and the wordline is at VBB.

When the output of the logic circuit 12 changes from VDD to VSS, that VSS level is passed through transistor 14 to the cross-coupled transistors 18 and 20 such that transistor 20 begins to turn on and transistor 18 begins to turn off. In parallel, the rising wordline voltage turns on transistor 22, which causes cross-coupled transistor 24 to be turned off. The size of the pull down logic of gate 12 and the size of transistor 14 must be large enough to provide enough current to counteract the pull-up current of transistor 18 on the gate of transistor 20. Similarly, the size of the pull up logic of gate 12 and the size of transistor 16 must be large enough to provide enough current to counteract the pull-down of transistor 22 on the gate of transistor 24 when the output of logic gate 12 changes from VSS to VDD. As transistors 20 and 24 are connected directly to the wordline, their sizes must be large enough to drive the wordline in a timely manner. The other transistors in the level shift circuit 10 and the logic gate 12 must also be sized large enough so that the level shift circuit 10 operates correctly. Thus logic gate 12 and level shift circuit 10 may require a relatively large area.

Furthermore, when the wordline voltage is switching from VBB to VPP or from VPP to VBB, crowbar current will occur in transistors 20 and 24 as there is a direct current path from VPP to VBB for a brief period of time.

The operation of the level shifter 10 can be enhanced if pass transistors 14 and 16 are fabricated with low threshold voltages. However, since current leakage is a growing problem in small geometry semiconductor processes, this solution may not be available for low power processes where only high Vt devices can be fabricated.

A second prior art circuit for translating a VDD/VSS logic signal to a VPP/VBB level wordline signal is shown in FIG. 2. The circuit in FIG. 2 includes a logic circuit 32, a level shift circuit 30 to shift the VDD/VSS level output of logic circuit 32 to VPP/VSS, a level shift circuit 31 to shift the VDD/VSS level output of logic circuit 32 to VDD/VBB, and wordline drive transistors 42 and 50. This circuit differs from the circuit in FIG. 1 in that the wordline drive transistors 42 and 50 are not part of the level shift circuitry, and that there are two separate, independent level shifters used to control the gates of wordline drive transistors 42 and 50. Since an extra stage is included in the circuit in FIG. 2, the level shift circuitry 31 and 30 and logic circuitry 32 can use smaller device sizes than the logic gate circuit 12 and level shift circuit 10 in FIG. 1. However, the size of the series connection of the pull-down in logic gate 32 and the pass device 34 must be large enough to overcome the pull-up current of transistor 38. Similarly, the size of the series connection of the pull-up in logic gate 32 and the pass device 36 must be large enough to overcome the pull-down current of transistor 52.

Crowbar current is also a concern in level shift circuits. Smaller device sizes in level shift circuitry also result in lower crowbar current consumption. The device sizes of the level shift circuits 30 and 31 in FIG. 2 can be smaller than the device sizes in the level shifter in FIG. 1, and thus contribute smaller crowbar current; however there are two level shift circuits. In addition, crowbar current will occur between devices 42 and 50.

As can be understood by any person skilled in the art, the loading of the logic circuit responsible for changing the state of the level shift circuit can affect wordline activation performance. Preferably, the wordlines are activated quickly in response to a decoded row address and/or control signal. Additionally, a larger load on that same logic circuit can require the use of larger device sizes in both the logic circuit and level shifter, increasing the area required. The additional cost of a multiple Vt fabrication process which might enable smaller device sizes may not be acceptable either. Minimizing crowbar current is also a concern in level shift circuits.

Accordingly, there is a need for a circuit to level shift a VDD/VSS logic signal to a VPP/VBB signal, where the level shift circuitry places minimal loading on the preceding logic circuit, occupies a small area and minimizes the crowbar currents.

SUMMARY OF THE INVENTION

It is an object of the present invention to provide a level shifter circuit having minimal loading on a preceding logic circuit while occupying a small area and minimizing crowbar currents.

In a first aspect, the present invention provides a level shifter circuit to translate a logic signal with logic '1' and '0' levels corresponding to first high and low voltage levels, driven from a logic circuit powered by first high and low voltage supplies, to an output signal with second high and low voltage levels. The level shifter circuit includes a first circuit, a second circuit and a crowbar current limiting circuit. The first circuit receives a second high voltage supply for providing the second high voltage level to the output signal in response to a first state of the logic signal. The second circuit receives a second low voltage supply for providing the second low voltage level to the output signal in response to the second state of the logic signal. The crowbar current limiting circuit can be connected to the output signal between the first circuit and the second circuit for limiting crowbar current between the first circuit and the second circuit during a state transition of the logic signal.

According to an embodiment of the present aspect, the crowbar current limiting circuit can include a first current limiting circuit and a second current limiting circuit. The first current limiting circuit can be connected to the output signal and in series with pull-up circuitry to the second high voltage supply in the first circuit. The second current limiting circuit can be connected to the output signal and in series with pull-down circuitry to the second low voltage supply in the second circuit. The first and second current limiting circuits can be responsive to a common input signal, and the common input signal can be logically derived from the logic signal. The first current limiting circuit can include a p-channel transistor and the second current limiting circuit can include an n-channel transistor.

In yet another embodiment of the present aspect, the first circuit can include a pull-down circuit, a first p-channel transistor and a second p-channel transistor. The pull-down circuit charges the gate of the first p-channel transistor to the first low voltage level in response to the first state of the logic signal. The first p-channel transistor can be connected to the second high voltage supply. The second p-channel transistor can be connected between the gate of the first p-channel transistor and the second high voltage supply, and the gate of the second p-channel transistor can be connected to the output signal of the level shifter for charging the gate of the first p-channel to the second high voltage level in response the second state of the logic signal.

In a further embodiment of the present aspect, the second circuit can include a pull-up circuit, a first n-channel transistor and a second n-channel transistor. The pull-up circuit charges the gate of the first n-channel transistor to the first high voltage level in response to the second state of the logic signal. The first n-channel transistor can be connected to the second low voltage supply. The second n-channel transistor can be connected between the gate of the first n-channel transistor and the second low voltage supply. The gate of the second n-channel transistor can be connected to the output signal of the level shifter for charging the gate of the first n-channel to the second low voltage level in response the first state of the logic signal.

In a second aspect, the present invention provides a level shifter circuit for translating an input logic signal with logic '1' and '0' levels corresponding to first high and low voltage levels driven from a logic circuit powered by first high and low voltage supplies, to an output signal with second high and low voltage levels. The level shifter circuit includes a first p-channel transistor, a second p-channel transistor, a first n-channel transistor, a second n-channel transistor, a third p-channel transistor, a second n-channel transistor, a third n-channel transistor, a fourth p-channel transistor, and a fourth n-channel transistor. The first p-channel transistor has a source connected to a second high voltage supply. The second p-channel transistor has a source connected to the second high voltage supply, a drain connected to a gate of the first p-channel transistor and a gate connected to the output signal. The first n-channel transistor has a drain connected to the drain of the second p-channel transistor, a source connected to the first low voltage supply and a gate connected to a first logic signal with the first high and low voltage levels. The third p-channel transistor is connected between a drain of the first p-channel transistor and the output signal, and has a gate connected to a second logic signal with the first high and low logic voltage levels. The second n-channel transistor has a source connected to the second low voltage supply. The third n-channel transistor has a source connected to the second low voltage supply, a drain connected to a gate of the second n-channel transistor, and a gate connected to the output signal. The fourth p-channel transistor has a drain connected to the gate of the second n-channel transistor, a source connected to the first high voltage supply and a gate connected to the first logic signal with the first high and low voltage levels. The fourth n-channel transistor is connected between the drain of the second n-channel transistor and the output signal, and has a gate connected to the second logic signal with first high and low logic voltage levels.

According to embodiments of the present aspect, the first logic signal can be generated by a logic gate powered by the first high and low voltage supply. In particular, the second logic signal can be generated from an inverter receiving the first logic signal, where the inverter can be powered by the first high and low voltage supply.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

A level shifter circuit for converting a logic signal with high and low logic voltage levels at the logic supply voltages to a signal with a high voltage level above the high logic voltage level and a low voltage below the low logic voltage level is disclosed. The disclosed level shifter circuit reduces the load on the logic circuit used for switching the state of the level shifter, minimizes crowbar currents and occupies a small area thus facilitating its layout in pitch-limited areas, without a significant change in performance.

Figure 3:
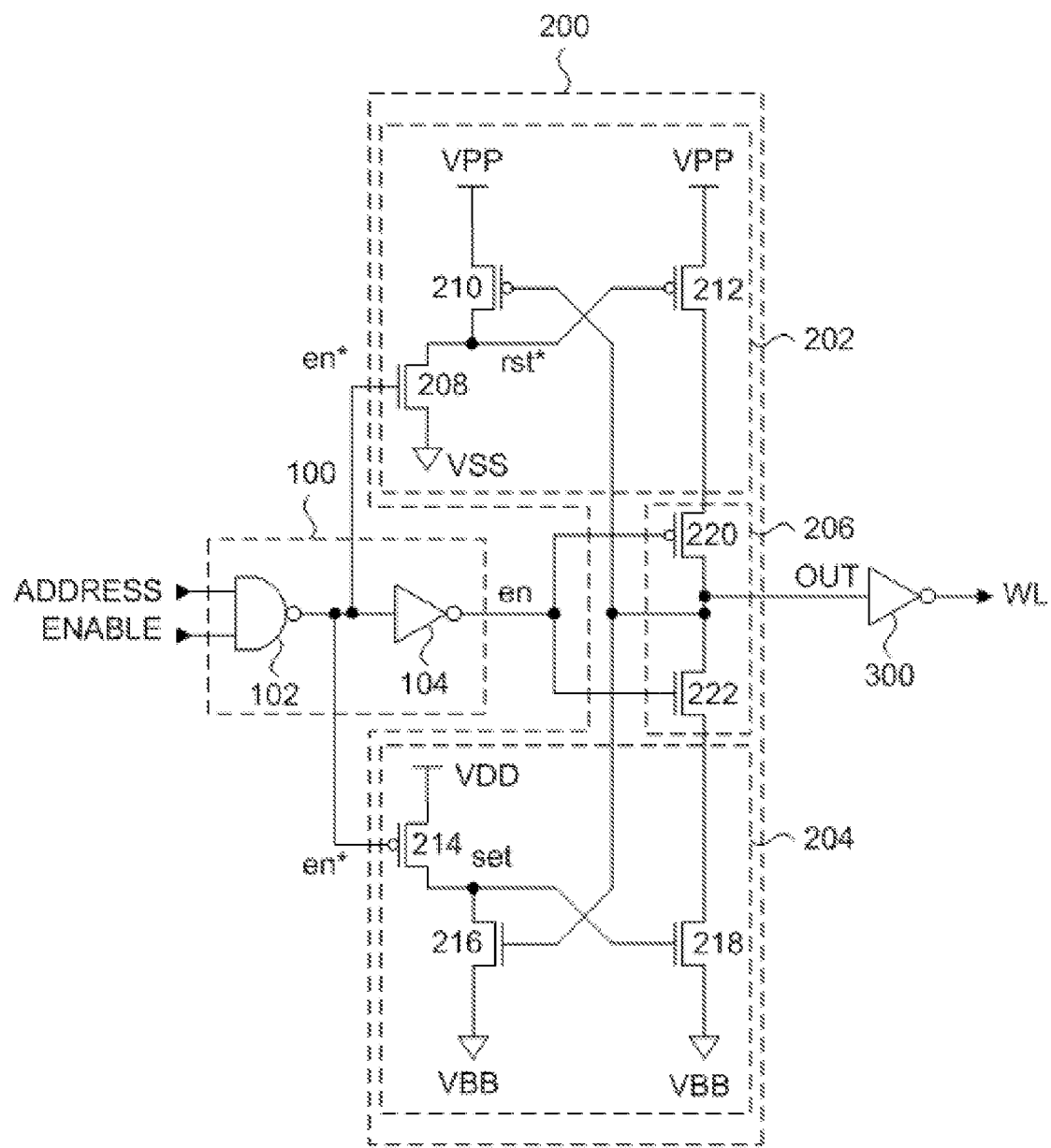

FIG. 3 is a circuit schematic of a level shifter circuit according to an embodiment of the present invention. FIG. 3 includes a logic circuit 100, a level shifter circuit 200, and a buffer 300. The level shifter circuit 200 will convert or translate a logic signal having first high and low supply voltage levels to a signal having second high and low supply voltage levels. The second high supply voltage level is greater than the first high supply voltage level while the second low supply voltage level is lower than the first low supply voltage level. In the presently shown embodiment, VDD and VSS are the first high and low supply voltage levels while VPP and VBB are the second high and low supply voltage levels.

Level shifter circuit 200 consists of circuit 202, used to control the drive of the level shifter output to the second high supply voltage level, and circuit 204, used to control the drive of the level shifter output to the second low supply voltage level and crowbar current limiting circuit 206. More specifically, circuit 202 provides VPP to the output signal while circuit 204 provides VBB to the output signal, via crowbar current limiting circuit 206. In the presently shown example, a buffer circuit 300 powered by the second high and low supply voltage levels can be used to drive a wordline WL. Crowbar current limiting circuit 206 is connected to node OUT, between circuits 202 and 204.

The logic circuit 100 provides one or more control signals to the level shift circuit 200 in response to an address and/or control signal. The logic circuit 100 can include any combination of known logic elements, preferably powered by first logic supply voltages VDD and VSS. One embodiment of the logic circuit 100 is shown in FIG. 3 and includes NAND gate 102 and inverter 104. NAND gate 102 provides a control signal en* in response to a combination of address and enable signals. The en* signal is inverted by inverter 104 to generate signal en. Both en and en* are provided to the level shift circuit 200. In the embodiment shown in FIG. 3, the en* signal is used to control the state of the level shift circuit 200 and the en signal is used to control crowbar current limiting circuit 206 in the level shift circuit 200.

In the embodiment shown in FIG. 3, the inputs to the level shifter circuit 200 are the signals en* and en from the logic circuit 100 and the output signal is labeled OUT. Circuit 202 of the level shifter circuit 200 consists of pull-down circuit 208, cross-coupled transistors 210 and 212 with their sources connected to VPP. Similarly, circuit 204 consists of pull-up circuit 214, cross-coupled transistors 216 and 218 with their sources connected to VBB.

Crowbar current limiting circuit 206 includes transistors 220 and 222. Transistor 220 is connected between the drain of transistor 212 and node OUT, which is connected to the gate of transistor 210. Transistor 222 is connected between the drain of transistor 218 and node OUT, which is also connected to the gate of transistor 216.

In the embodiment shown in FIG. 3, pull-down circuit 208 consists of an n-channel transistor with its source connected to VSS, its drain labeled rst* connected to the drain of transistor 210 and the gate of transistor 212, and its gate connected to the signal en* provided from the logic circuit 100. When the output of the level shift circuit is VBB, the en* signal is low so that the pull-down circuit 208 is off, transistor 210 is on, rst* is at VPP and transistor 212 is off. When the state of the logic circuit 100 changes such that the output of the level shifter is to be changed to VPP, the pull-down circuit 208 is enabled, connecting the rst* node to VSS. Pull-down circuit 208 provides a direct connection between the rst* node and VSS, unlike prior art circuits in which the connection was provided through a pass device and the pull-down circuitry of the logic circuit.

Similarly, pull-up circuit 214 consists of a p-channel transistor with its source connected to VDD, its drain labeled set connected to the drain of transistor 216 and the gate of transistor 218, and its gate connected to the signal en* provided from the logic circuit 100. When the output of the level shift circuit is VPP, the pull-up circuit 214 is off, transistor 216 is on, set is at VBB and transistor 218 is off. When the state of the logic circuit 100 changes such that the output of the level shifter is to be changed to VBB, the pull-up circuit 214 is enabled, connecting the set node to VDD. Pull-up circuit 214 provides a direct connection between the set node and VDD, unlike prior art circuits in which the connection was provided through a pass device and the pull-up circuitry of the logic circuit.

Figure 1:
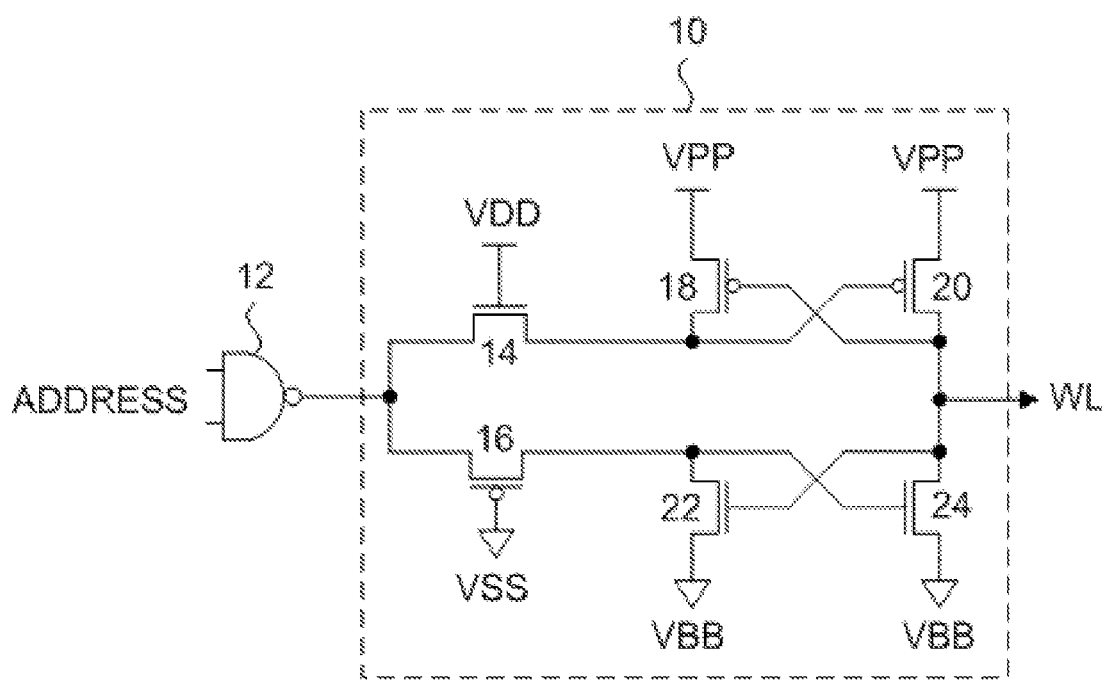
FIG. 1 is a circuit schematic of a level shifter circuit of the prior art.
Figure 2:
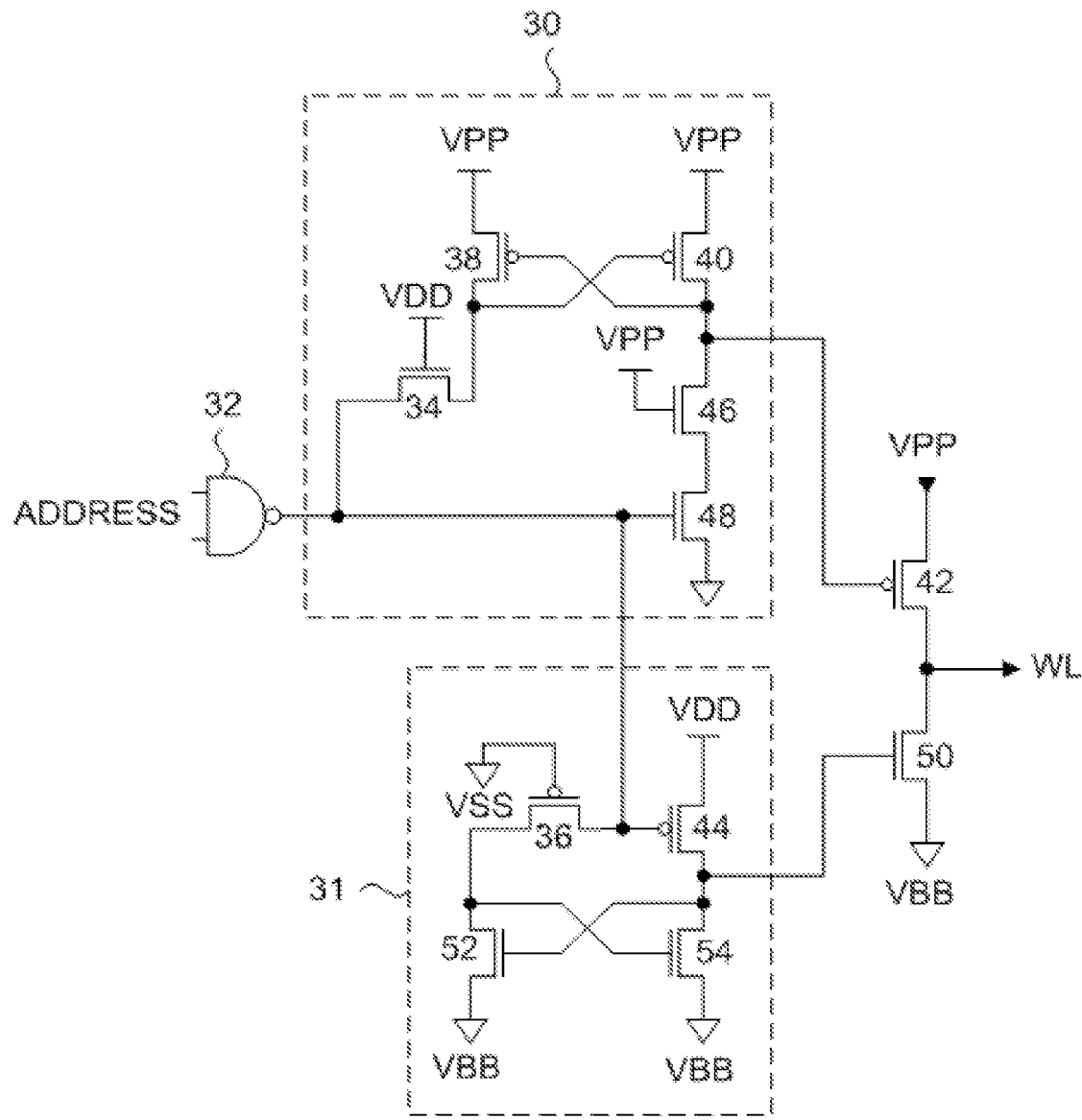
FIG. 2 is a circuit schematic of another level shifter circuit of the prior art; and, FIG. 3 is a circuit schematic of a level shifter circuit according to an embodiment of the present invention.

As the pull-down current of node rst* and the pull-up of node set is not provided from the logic circuit 100, the device sizes in logic circuit 100 can be made smaller than those in logic circuits 12 and 32 of FIGS. 1 and 2 respectively. Additionally, the pull-down circuit 208 and pull-up circuit 214 can be sized smaller than the pass devices in FIGS. 1 and 2.

When the output node OUT is at VPP, transistors 212 and 220 are on. Transistor 218 is off and transistor 222 is partially on. When the output of logic circuit 100 causes the level shifter output to change to VBB, the current capability of transistor 220 is reduced by changing its gate voltage from VSS to VDD. At the same time, transistors 222 and 218 are turned fully on. This enables the series path of devices 222 and 218 to pull node OUT from VPP to VBB quickly with limited crowbar current consumption.

Similarly, when the output node OUT is at VBB, transistors 218 and 222 are on. Transistor 212 is off and transistor 220 is partially on. When the output of logic circuit 100 causes the level shifter output to change to VPP, the current capability of transistor 222 is reduced by changing its gate voltage from VDD to VSS. At the same time, transistors 220 and 212 are turned fully on. This enables the series path of devices 220 and 212 to pull node OUT from VBB to VPP quickly with limited crowbar current consumption.

Thus transistors 220 and 222 work to limit crowbar current in the level shifter circuit 200. Additionally, they provide some isolation between transistors 212 and 218.

In describing the operation of the circuitry in FIG. 3, it is assumed that the wordline voltage should be at VPP to access the memory cell and that it should be at VBB when the memory cell is not being accessed. An alternate embodiment of the circuit could have the active wordline voltage be VBB and the inactive wordline voltage be VPP.

When the circuitry in FIG. 3 is connecting VBB to the wordline signal WL, at least one of the inputs to NAND gate 102 is at low logic level VSS, such that the signal en* is VDD and the signal en is VSS. Thus pull-down 208 is on, rst* is at VSS and transistor 212 is on. Transistor 220 is also on, so that node OUT is at VPP. This ensures that transistor 210 is off. It also ensures that transistor 216 is on so that the node set is at VBB and transistor 218 is off. As the signal en* is at VDD, transistor 214 is off. Transistor 222 will be partially on as its gate is at VSS, which is higher than its source voltage, which will be between VBB and VSS-Vtn of transistor 222.

When all of the inputs to NAND gate 102 are at VDD, node en* changes to VSS and node en changes to VDD. This causes pull-down 208 to turn off, allowing node rst* to float at VSS. The low en* signal also enables pull-up 214 causing node set to rise toward VDD. This causes transistor 218 to start to turn on. At the same time, the VDD level en signal turns transistor 222 fully on and reduces the current capability of transistor 220 allowing the series connection of transistor 218 and 222 to pull the node OUT from VPP to VBB easily, with limited crowbar current consumption. As node OUT is pulled toward VBB, transistor 210 is turned on, and charges node rst* to VPP. This turns off transistor 212, allowing node OUT to be fully charged to VBB. This causes the wordline voltage to rise to VPP.

The state of the level shifter circuit 200 changes when at least one of the inputs to NAND gate 102 falls to VSS, causing node en* to change to VDD and node en to change to VSS. This causes pull-up 214 to turn off, allowing node set to float at VDD. The high en* signal also enables pull-down 208 causing node rst* to fall toward VSS. This causes transistor 212 to start to turn on. At the same time, the VSS level en signal turns transistor 220 fully on and reduces the current capability of transistor 222 allowing the series connection of transistor 212 and 220 to pull the node OUT from VBB to VPP easily, with limited crowbar current consumption. As node OUT is pulled toward VPP, transistor 216 is turned on, and charges node set to VBB. This disables transistor 218, allowing node OUT to be fully charged to VPP. This causes the wordline voltage to fall to VBB.

As described above, the level shifter circuit 200 allows the use of small transistor sizes in both the level shifter itself and the logic circuitry that drives it, making it ideal for pitch-limited areas. While the embodiments of the present invention are preferably implemented in DRAM row decoder circuits, they can be used in any type of memory or system circuit that requires the conversion of the high voltage level of logic signals to a higher power supply voltage and also the conversion the low voltage level of logic signals to a lower power supply voltage.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. An apparatus for translating a logic signal with logic '1' and '0' levels corresponding to first high and low voltage levels, driven from a logic signal provider powered by first high and low voltage supplies, to an output signal with second high and low voltage levels, the apparatus comprising:
   a first voltage provider to be operated with a second high voltage supply for providing the second high voltage level to the output signal in response to a first signal at the first low voltage supply, the first signal being driven to the first low voltage supply in response to a first state of the logic signal;
   a second voltage provider to be operated with a second low voltage supply for providing the second low voltage level to the output signal in response to a second signal at the first high voltage supply, the second signal being driven to the first high voltage supply in response to a second state of the logic signal; and
   a current controller connected to the output signal between the first voltage provider and the second voltage provider for limiting current between the first voltage provider and the second voltage provider during a state transition of the logic signal.

2. The apparatus of claim 1, wherein the current controller includes:
   a first current limiter connected to the output signal and in series with pull-up circuitry to the second high voltage supply in the first voltage provider; and
   a second current limiter connected to the output signal and in series with pull-down circuitry to the second low voltage supply in the second voltage provider, the first and second current limiters being responsive to a common input signal.

3. The apparatus of claim 2, wherein the common input signal is logically derived from the logic signal.

4. The apparatus circuit of claim 2, wherein:
   the first current limiter comprises a first type transistor; and
   the second current limiter comprises a second type transistor, the second type being an opposite type of the first type.

5. The apparatus circuit of claim 4, wherein the first and second type transistors include a p-channel transistor and an n-channel transistor, respectively.

6. The apparatus of claim 1, wherein the first voltage provider includes:
   a first p-channel transistor connected to the second high voltage supply;
   a discharger for discharging the gate of the first p-channel transistor to the first low voltage level in response to the first state of the logic signal;
   a second p-channel transistor connected between the gate of the first p-channel transistor and the second high voltage supply, the gate of the second p-channel transistor being connected to the output signal of the apparatus for charging the gate of the first p-channel to the second high voltage level in response the second state of the logic signal.

7. The apparatus of claim 1, wherein the second voltage provider includes:
   a pull-up circuit for charging the gate of a first n-channel transistor to the first high voltage level in response to the second state of the logic signal, the first n-channel transistor being connected to the second low voltage supply; and
   a second n-channel transistor connected between the gate of the first n-channel transistor and the second low voltage supply, the gate of the second n-channel transistor being connected to the output signal of the apparatus for charging the gate of the first n-channel to the second low voltage level in response the first state of the logic signal.

8. A apparatus for translating an input logic signal with logic '1' and '0' levels corresponding to first high and low voltage levels driven from a logic circuit powered by first high and low voltage supplies, to an output signal with second high and low voltage levels, the apparatus comprising:
   a first p-channel transistor having a source connected to a second high voltage supply;
   a second p-channel transistor having a source connected to the second high voltage supply, a drain connected to a gate of the first p-channel transistor and a gate connected to the output signal;
   a first n-channel transistor having a drain connected to the drain of the second p-channel transistor, a source connected to the first low voltage supply and a gate connected to a first logic signal with the first high and low voltage levels;
   a third p-channel transistor connected between a drain of the first p-channel transistor and the output signal, the third p-channel transistor having a gate connected to a second logic signal with the first high and low logic voltage levels;
   a second n-channel transistor having a source connected to a second low voltage supply;
   a third n-channel transistor having a source connected to the second low voltage supply, a drain connected to a gate of the second n-channel transistor, and a gate connected to the output signal;

a fourth p-channel transistor having a drain connected to the gate of the second n-channel transistor, a source connected to the first high voltage supply and a gate connected to the first logic signal with the first high and low voltage levels; and a fourth n-channel transistor connected between the drain of the second n-channel transistor and the output signal, and a gate connected to the second logic signal with the first high and low logic voltage levels.

9. The apparatus of claim 8, wherein the first logic signal is generated by a logic gate powered by the first high and low voltage supplies.

10. The apparatus of claim 9, wherein the second logic signal is generated from an inverter receiving the first logic signal, the inverter being powered by the first high and low voltage supplies.

11. An apparatus for level shifting first high and low voltage levels to second high and low voltage levels, the first high and low voltages being represented by an input logic signal with logic '1' and '0' levels, the input logic signal being provided from a logic signal provider operated with the first high and low voltages, the second high and low voltage levels being represented by an output logic signal, the apparatus comprising:

a first voltage provider to be operated with a second high voltage supply for providing the second high voltage level to the output signal in response to a first signal at the first low voltage supply, the first signal being driven to the first low voltage supply in response to a first state of the logic signal;

a second voltage provider to be operated with a second low voltage supply for providing the second low voltage level to the output signal in response to a second signal at the first high voltage supply, the second signal being driven to the first high voltage supply in response to a second state of the logic signal; and, a current controller connected to the output signal between the first voltage provider and the second voltage provider for limiting current between the first voltage provider and the second voltage provider during a state transition of the logic signal.

12. The apparatus of claim 11, wherein the current controller includes:

a first current limiter connected to the output signal and in series with pull-up circuitry to the second high voltage supply in the first voltage provider; and a second current limiter connected to the output signal and in series with pull-down circuitry to the second low voltage supply in the second voltage provider, the first and second current limiters being responsive to a common input signal.

13. The apparatus of claim 12, wherein the common input signal is logically derived from the logic signal.

14. The apparatus circuit of claim 13, wherein:
the first current limiter comprises a first type transistor; and
the second current limiter comprises a second type transistor, the second type being an opposite type of the first type.

15. The apparatus circuit of claim 14, wherein the first and second type transistors include a p-channel transistor and an n-channel transistor, respectively.

16. A method for shifting levels of first high and low voltage levels to second high and low voltage levels, the first high and low voltages being represented by an input logic signal with logic '1' and '0' levels, the input logic signal being provided from a logic signal provider operated with the first high and low voltages, the second high and low voltage levels being represented by an output logic signal, the method comprising:

providing the second high voltage level to the output signal in response to a first signal at the first low voltage supply, the first signal being driven to the first low voltage supply in res to a first state of the logic signal;

providing the second low voltage level to the output signal in response to a second signal at the first high voltage supply, the second signal being driven to the first high voltage supply in response to a second state of the logic signal; and controlling current between the first voltage provider and the second voltage provider during a state transition of the logic signal.

17. The method of claim 16, wherein the step of controlling includes:
limiting current of the second high voltage supply; and
limiting current of the second low voltage.

18. The method of claim 17, wherein the common input signal is logically derived from the logic signal.

* * * * *